(12) United States Patent
Reddy et al.

(10) Patent No.: US 10,034,386 B2
(45) Date of Patent: Jul. 24, 2018

(54) PATTERNING OF ELECTROLESS METALS BY SELECTIVE DEACTIVATION OF CATALYSTS

(71) Applicant: Averatek Corporation, Santa Clara, CA (US)

(72) Inventors: Mihir Reddy, Pleasanton, CA (US); Michael Riley Vinson, Sunnyvale, CA (US); Sunity K. Sharma, Fremont, CA (US)

(73) Assignee: AVERATEK CORPORATION, Santa Clara, CA (US)

( * ) Notice: Subject to any disclaimer, the term of this patent is extended or adjusted under 35 U.S.C. 154(b) by 0 days.

(21) Appl. No.: 15/632,216

(22) Filed: Jun. 23, 2017

(65) Prior Publication Data

US 2017/0354040 A1 Dec. 7, 2017

Related U.S. Application Data

(62) Division of application No. 14/918,227, filed on Oct. 20, 2015, now Pat. No. 9,699,914.

(Continued)

(51) Int. Cl.
*H05K 1/11* (2006.01)
*H05K 3/18* (2006.01)
(Continued)

(52) U.S. Cl.
CPC ............. *H05K 3/184* (2013.01); *C23C 18/00* (2013.01); *C23C 18/161* (2013.01); *C23C 18/1608* (2013.01); *C23C 18/1817* (2013.01); *C23C 18/1841* (2013.01); *C23C 18/1844* (2013.01); *C23C 18/1865* (2013.01); *C23C 18/1889* (2013.01); *C23C 18/1893* (2013.01); *C23C 18/208* (2013.01); *C23C 18/2033* (2013.01); *C23C 18/2086* (2013.01);
(Continued)

(58) Field of Classification Search
CPC ... H05K 1/11; H05K 3/00; H05K 3/10; H05K 3/18; H05K 3/24; H05K 3/34; H05K 3/38; H05K 3/42; H05K 3/46; C23C 18/00; C23C 18/16; C23C 18/161; H01L 23/48; H01L 23/52
USPC ..... 174/257, 255, 256, 262; 428/138, 195.1, 428/209, 643; 438/64, 597, 678; 205/123, 126, 163
See application file for complete search history.

(56) References Cited

U.S. PATENT DOCUMENTS 3,775,121 A 11/1973 Sharp
3,791,340 A 2/1974 Ferrara
(Continued)

*Primary Examiner* — Xiaoliang Chen
(74) *Attorney, Agent, or Firm* — Fish IP Law, LLC

(57) ABSTRACT

Methods and devices for patterning electroless metals on a substrate are presented. An active catalyst layer on the substrate can be covered with a patterned mask and treated with a deactivating chemical reagent, which deactivates the catalyst layer not covered by the mask. Once the patterned mask is removed, the electroless metal layer can be placed to have a patterned electroless metals. Alternatively, a substrate can be coated with a blocking reagent in a pattern first to inhibit formation of the catalyst layer before a catalyst layer can be placed over the blocking agent layer and then electroless metal layer is placed on the catalyst layer. The pattern of the blocking reagent acts as a negative pattern of the final conductive line pattern.

8 Claims, 5 Drawing Sheets

Related U.S. Application Data

(60) Provisional application No. 62/065,879, filed on Oct. 20, 2014.

(51) Int. Cl.

| | | |
|---|---|---|
| *C23C 18/18* | (2006.01) | |
| *C23C 18/00* | (2006.01) | |
| *C23C 18/20* | (2006.01) | |
| *C23C 18/16* | (2006.01) | |
| *C23C 18/38* | (2006.01) | |
| *C23C 18/32* | (2006.01) | |
| *C23C 18/30* | (2006.01) | |

(52) U.S. Cl.
CPC .............. *C23C 18/30* (2013.01); *C23C 18/32* (2013.01); *C23C 18/38* (2013.01); *H05K 2203/0565* (2013.01); *H05K 2203/125* (2013.01)

(56) References Cited

U.S. PATENT DOCUMENTS

| | | | |
|---|---|---|---|
| 4,293,592 A | 10/1981 | Morishita et al. | |
| 4,388,351 A | 6/1983 | Sawyer | |
| 4,666,735 A | 5/1987 | Hoover et al. | |
| 4,666,739 A | 5/1987 | Roubal | |
| 5,007,990 A * | 4/1991 | Bladon | C25D 5/54 205/126 |
| 5,281,447 A | 1/1994 | Brady et al. | |
| 5,532,070 A * | 7/1996 | Takahashi | H05K 3/244 428/209 |
| 6,194,032 B1 | 2/2001 | Svedberg et al. | |
| 6,413,845 B1 * | 7/2002 | Izumi | H01L 21/76838 257/E21.582 |
| 6,607,981 B1 * | 8/2003 | Takahashi | H01L 21/288 257/E21.174 |
| 6,609,297 B1 * | 8/2003 | Hiramatsu | H05K 3/0008 174/255 |
| 6,627,544 B2 | 9/2003 | Izumi et al. | |
| 6,828,510 B1 * | 12/2004 | Asai | H05K 3/387 174/255 |
| 7,371,974 B2 * | 5/2008 | Toyoda | H01L 21/486 174/262 |
| 8,110,254 B1 | 2/2012 | Sharma et al. | |
| 8,628,818 B1 | 1/2014 | Sharma et al. | |
| 2001/0010702 A1 * | 8/2001 | Tanaka | B23K 26/0608 372/99 |
| 2002/0019565 A1 * | 2/2002 | Berk | C07C 227/02 562/553 |
| 2002/0117400 A1 * | 8/2002 | Hotta | H05K 3/184 205/163 |
| 2003/0176735 A1 * | 9/2003 | Berk | C07C 227/02 562/571 |
| 2004/0026781 A1 * | 2/2004 | Nakai | C23C 18/54 257/737 |
| 2004/0040856 A1 * | 3/2004 | Hamano | C25D 5/022 205/123 |
| 2005/0258522 A1 * | 11/2005 | En | C23G 1/10 257/670 |
| 2007/0057022 A1 * | 3/2007 | Mogami | H01L 21/563 228/101 |
| 2008/0075919 A1 * | 3/2008 | Suzuki | H05K 3/388 428/138 |
| 2008/0230263 A1 * | 9/2008 | En | C25D 3/38 174/262 |
| 2009/0174052 A1 * | 7/2009 | Sogawa | H01L 23/24 257/690 |
| 2012/0171432 A1 * | 7/2012 | Lee | C23C 18/1605 428/195.1 |
| 2016/0181466 A1 * | 6/2016 | Adachi | H01L 31/0747 438/64 |

\* cited by examiner

PATTERNING OF ELECTROLESS METALS BY SELECTIVE DEACTIVATION OF CATALYSTS This application is a divisional application of U.S. patent application Ser. No. 14/918,227 filed Oct. 15, 2015, which claims priority to U.S. Provisional Patent Application No. 62/065,879 filed Oct. 20, 2014. Where a definition or use of a term in a reference that is incorporated by reference is inconsistent or contrary to the definition of that term provided herein, the definition of that term provided herein is deemed to be controlling.

FIELD OF THE INVENTION

The present invention relates to methods and systems for patterning electroless metals on a substrate. In particular, the present invention relates to methods and systems that utilize an inhibitor that deactivates catalysts in the selective area on the substrate.

BACKGROUND

The following description includes information that may be useful in understanding the present invention. It is not an admission that any of the information provided herein is prior art or relevant to the presently claimed invention, or that any publication specifically or implicitly referenced is prior art.

Electroless metal deposition uses a redox reaction to deposit a layer of metals on a substrate without passage of an electric current. In this process, several types of metals can be used as catalysts for deposition of the metals. For example, palladium, platinum, silver, are well known catalysts for initiating electroless metal deposition on substrates. The catalysts facilitate initiation and subsequent deposition of electroless metals (e.g., copper, tin, etc.) from solutions of metal salts. The catalysts can be generated and deposited on a substrate in various forms (e.g., palladium can be deposited as colloidal palladium, ionic palladium, etc.).

Creation of metal patterns on various types of substrates is an essential part of electronic systems that are used in consumer products, communications, military, medical, and other industry segments. In order to make electronic systems more portable, mobile, functional, smaller, and less expensive, it is necessary to make a higher density, small sized circuitry, which requires new, cost effective pattern metallization processes.

Conventional fabrication of printed circuits uses a subtractive method of fabrication. To produce a desired copper pattern, subtractive processing uses a photolithography exposure and chemical etch to remove most of the copper that was laid down. Yet, such methods are expensive because it wastes a large portion of copper that is removed by etching steps, and is also time-consuming.

Many efforts have been put forth to create metal patterns using electroless metal deposition. For example, a printed circuit board can be generated by creating a negative resist pattern over the substrate surface, etching the surface, photosensitization and/or photo-desensitization, covering and/or stripping masks, and so on. U.S. Pat. No. 3,775,121 to Sharp discloses a method of deactivating of catalytic species deposited on the surface, and selectively reactivating a portion of the deactivated catalytic species using ultraviolet (UV) radiation. Similarly, U.S. Pat. No. 8,110,254 to Sharma et al discloses a method of creating a circuit pattern by decomposing catalytic precursor using electromagnetic radiation and energy (e.g., thermal energy, laser, UV heaters, ion beams, e-beams, etc.) on the substrate and/or palladium precursor.

In another example, U.S. Pat. No. 3,791,340 to Ferrara discloses a method of a depositing a metal pattern on a surface by photo-deactivating the catalytic species using some type of UV radiation. In Ferrara, some portions of the surface are covered with a mask that protects the catalytic species under the mask from being deactivated. U.S. Pat. No. 8,628,818 to Sharma et al. also discloses a method of creating a circuit pattern by using a printed, removable mask over precursor according to negative of desired pattern.

However, those methods may not be used effectively for catalysts that are not easily imageable to allow selective metallization in the form of an image. In addition, many of those methods require multiple steps that increase the complexity and cost of fabrication. Thus, there is still a need for an improved methods and systems for patterning electroless metals on a substrate.

SUMMARY OF THE INVENTION

The inventive subject matter provides systems and methods for patterning of electroless metals. One aspect of the invention includes a method of patterning of electroless metals. One embodiment of this method includes a step of placing a catalyst layer on a substrate. Once the catalyst layer is placed on the substrate, a mask layer having a circuit pattern is placed over the catalyst layer to mask the active catalyst layer. Then, the area of exposed catalyst layer is deactivated using deactivating reagent. The mask layer is then removed and the active catalyst layer is exposed to electroless metal composition to form a pattern of the electrolessly deposited metal on the substrate.

Another embodiment of this method includes a step of placing a blocking reagent in a pattern on a substrate to form a substrate with a blocking agent layer. Then, a catalyst layer is placed over the substrate with a blocking agent layer. The blocking reagent inhibits a formation of the catalyst layer on the blocking agent layer so that the catalyst layer that is not placed on the blocking agent layer is active. The method further includes a step of placing an electroless metal layer on the catalyst layer.

Another aspect of the invention includes a device having an electrical conductivity in a pattern. The device includes a substrate coated with a first layer a blocking reagent in a pattern. On the coated substrate, the device further includes a second layer of catalyst. The device further includes a third layer of an electroless metal layer that is placed over the second layer of catalyst that is active. All publications identified herein are incorporated by reference to the same extent as if each individual publication or patent application were specifically and individually indicated to be incorporated by reference.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1:
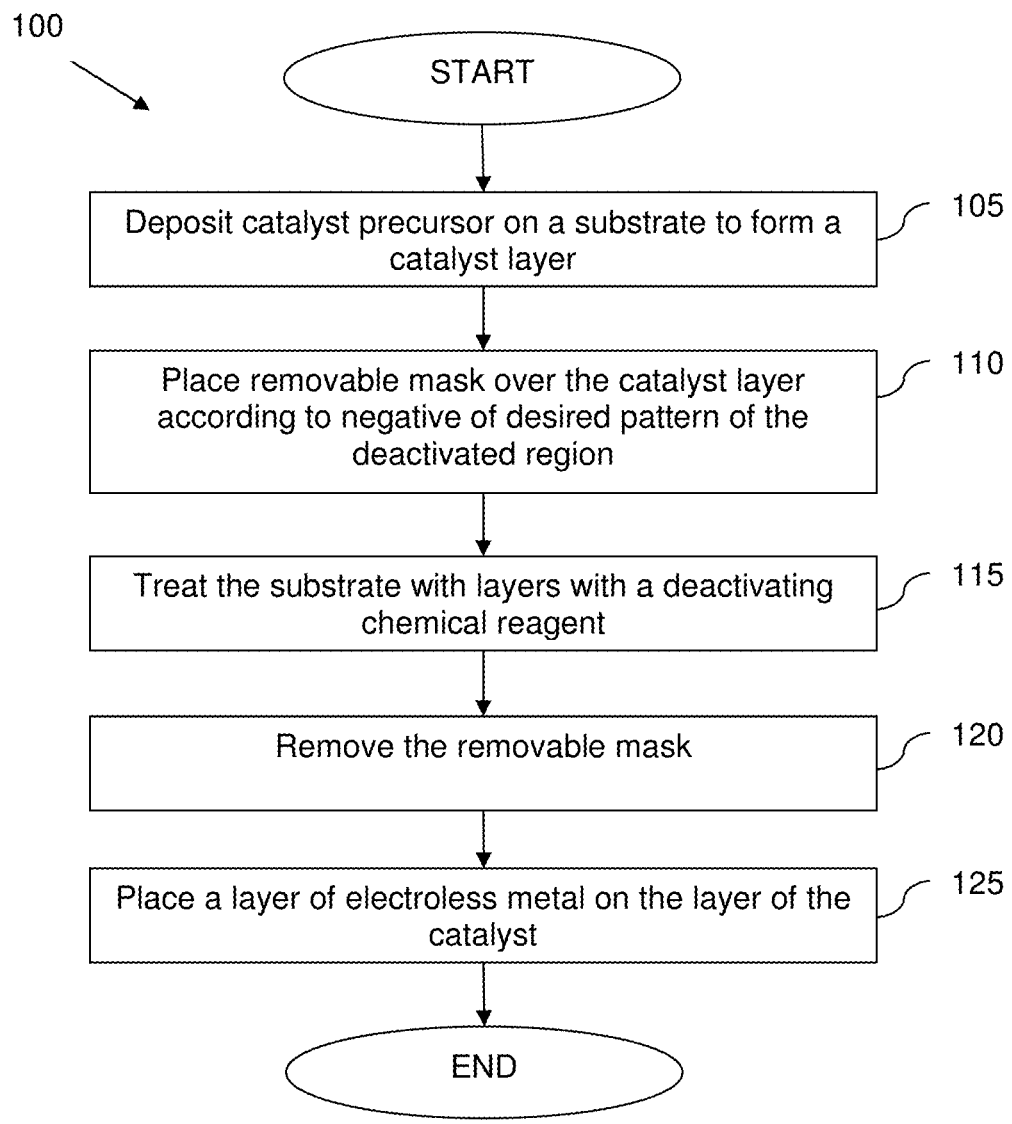
FIG. 1 illustrates a flowchart of one embodiment of a method of patterning of electroless metals.

The present invention relates to methods, systems and devices for patterning electroless metals on a substrate. The principles and operations for such methods and systems, according to the present invention, may be better understood with reference to the accompanying description and drawings.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In some embodiments, the numbers expressing quantities or ranges used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements. Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

All methods described herein can be performed in any suitable order unless otherwise indicated herein or otherwise clearly contradicted by context. The use of any and all examples, or exemplary language (e.g., "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified, thus fulfilling the written description of all Markush groups used in the appended claims.

One aspect of the present invention includes a method of patterning of electroless metals using electroless plating. Electroless plating uses a redox reaction to deposit metal on an object without the passage of an electric current. One of the main advantages of electroless plaiting is that it allows a constant metal ion concentration to bathe all parts of the object. Thus, electroless plating allows electroless metal to be deposited evenly along edges, inside holes, and over irregularly shaped objects, which are difficult to plate evenly with electroplating.

The present invention solves the problem of higher density metallization by selectively preventing metallization. It is known in the art that some precious metals are catalysts for the deposition of electroless metals, and various forms of these catalysts have been used for years in fabricating printed circuit boards using subtractive etch processes. More recently, a new method of fabricating printed circuits using a precursor ink comprising palladium has been developed. The precursor ink is imageable, and therefore selectively allows the deposition of an atomic layer of a catalyst on a substrate that then causes copper and other metals to be deposited on the pattern made by the catalyst layer. Therefore, if the pre-cursor ink is imaged into a pattern, the copper is deposited accordingly on that pattern.

The present invention provides alternative ways to fabricate printed circuits, by selectively deactivating the catalytic properties of the precursor ink, and thereby prevent the deposition of copper and other metals on the precursor ink. Imaging this new catalyst blocker substance with a negative image of the metalized pattern can therefore create the same metalized pattern as that of positively imaging the precursor ink.

FIG. 1 illustrates one preferred embodiment of method 100 of patterning an electroless metal using electroless plating. In this embodiment, the method begins with a step of depositing catalyst precursor on the substrate 105 to form a substrate that is at least partially coated with the catalyst layer. Any suitable types of material, rigid or flexible, can be used as a substrate. For example, a substrate can comprise a material of polyimide, a cloth, a plastic, a metal, a ceramic, and a resin. It is further contemplated that many precious metals can be used as catalyst for electroless plating, including for example, palladium, gold, silver, tin, and platinum.

In a preferred embodiment, the catalyst precursor includes elemental and active palladium. The active palladium approximately has a zero valance. The active palladium is also ideally generated or otherwise disposed mono-atomically onto the substrate. Elemental palladium does not readily bind to a surface mono-atomically or with an approximately zero valance, and needs to be deliberately processed to achieve such a state.

The catalyst precursor may be deposited as a solution. For example, a palladium precursor solution can be prepared to include a Lewis base ligand and a palladium compound in a solvent. In a specific embodiment, the palladium precursor solution is prepared in a form of palladium propionate (e.g., palladium (II) propionate-cyclopentylamine complex, etc.). Additional details on preparing a palladium propionate solution are described in the U.S. Pat. No. 8,628,818, which is incorporated herein by reference in its entirety herein.

The catalyst precursor or a catalyst precursor solution can be delivered to a substrate in any number of different manners. For example, the catalyst precursor can be blanket deposited, without a pattern onto the substrate to deposit the catalyst precursor. In other embodiments, the catalyst precursor solution can be delivered only to selective regions of the substrate according to a desired pattern.

A blanket deposition involves coating a large portion or the entire substrate surface with the palladium ink and without defining a pattern. Dip coating represents one suitable method for blanket deposition of palladium ink. Dip coating allows substrates of any shape and size to have the palladium precursor solution disposed thereon. For example, strands and fibers such as those later weaved together may be dip-coated, in addition to non-flat surfaces.

In one embodiment, the printing apparatus permits conformal printing of the precursor. Conformal printing refers to printing precursor on non-flat and three-dimensional surfaces. For example, the non-flat surface may include the inner surface of a cell phone housing or other portable electronic device, which is commonly curved and custom shaped. In one embodiment, conformal printing apparatus includes a pen, movable in three dimensions, that dispenses palladium ink in response to a control signal. Based on a known position of the controlled pen relative to the non-flat substrate, ink is released at controlled times and a pattern is then produced on the conformal surface as desired.

It is especially preferred that the catalyst layer has an average thickness of less than 10 atoms, more preferably less than 5 atoms, and most preferably less than 3 atoms. In some embodiments, the thickness of the catalyst layer is achieved by modulating the concentration of catalyst metals in the solution. For example, it is preferred that a palladium propionate solution contains palladium in a concentration less than 10,000 ppm, more preferably 7,000 ppm, most preferably, less than 5,000 ppm.

Once the catalyst layer is placed on the substrate, the method continues with a step of placing a layer of patterned mask on the catalyst layer 110. In a preferred embodiment, the mask includes a negative pattern of the final conductive line pattern (e.g., a circuit pattern, etc.). The negative pattern is a pattern that is substantially opposite to what the final conductive line pattern will be on the substrate. In essence, the areas not covered by the negative pattern will be the areas where plating or printing of the conductive lines will occur. In some embodiments, the negative pattern is in two-dimensional (X-axis and Y-axis). In other embodiment, it is contemplated that the negative pattern is in three-dimensional (X-, Y-, and Z-axis).

The negative pattern of the mask can be created by various printing techniques. For example, conventional inkjet printers may be used to pattern the removable mask. It is also contemplated that any suitable types of printing technique can be used to generate the pattern: screen printing, pad-printing, Gravure printing, a stencil, rotogravure, flexographic techniques, brush coating, or various other blank coating techniques.

It is contemplated that any suitable types of material can be used as a mask. Yet, it is especially preferred that the mask comprises a material that is removable from the substrate. For example, the mask can comprise a resin or polymeric material that is dissolvable in an organic solvent and is insoluble in water and electroless metal solution (e.g., Elvacite™ 2046 dissolved in methyl ethyl ketone (MEK), etc). However, in some embodiments, it is contemplated that a mask can comprise any material that is at least partially dissolvable in an aqueous solution.

After the mask is placed on the catalyst layer, the method continues with a step of treating the substrate with a layer of catalyst and a layer of patterned mask with a deactivating chemical reagent 115. Many catalyst metals, such as palladium, platinum, silver, gold, are known to bind well to sulfur containing compounds and in general to the chalcogenides. A chalcogenide is a chemical compound consisting of at least one chalcogen anion and at least one more electropositive element, which includes sulfides, selenides, and tellurides chemicals. Because sulfur containing compounds or chalcogenides can bind to palladium or other types of catalysts, sulfur containing compounds and chalcogenides can act as deactivating chemical reagents that can inhibit the catalyst metals from acting as a catalyst for the electroless copper plating. Thus, the portion of the catalyst layer that is not covered by a mask layer, and treated with a deactivating chemical reagent, would be deactivated.

Organo disulfides, diselenides or tellurides or mixtures thereof can also be used as potential deactivating agents that may combine with the catalyst thus disabling its ability to initiate the electroless metal deposition.

In some preferred embodiments, the sulfur containing compounds that operate as deactivating chemical reagents include yellow ammonium sulfide, potassium polysulfide or antimony pentasulfide ($Sb_2S_5$). However, it is contemplated that any suitable sulfur containing compound(s) that can deactivate the catalyst can be used as a deactivating chemical reagent.

Once at least a portion of the catalyst layer is deactivated by treating with a deactivating chemical reagent, the method continues with a step of removing the layer of patterned mask 120. Then, the method continues with a step of placing a layer of electroless metal on the layer of catalyst 125. While any suitable types of methods for various types of electroless metals (e.g., copper, nickel, etc.) can be utilized, it is preferred that the substrate with the catalyst layer is bathed or dipped into an electroless metal solution (e.g., a solution of electroless copper, M-22, supplied by MacDermid, Inc.).

Alternatively, instead of using the mask layer with a pattern to cover a portion of the catalyst layer, the catalyst layer can be selectively deactivated by applying the deactivating chemical reagent(s) in a pattern, either in a solution or a paste form.

Figure 2:
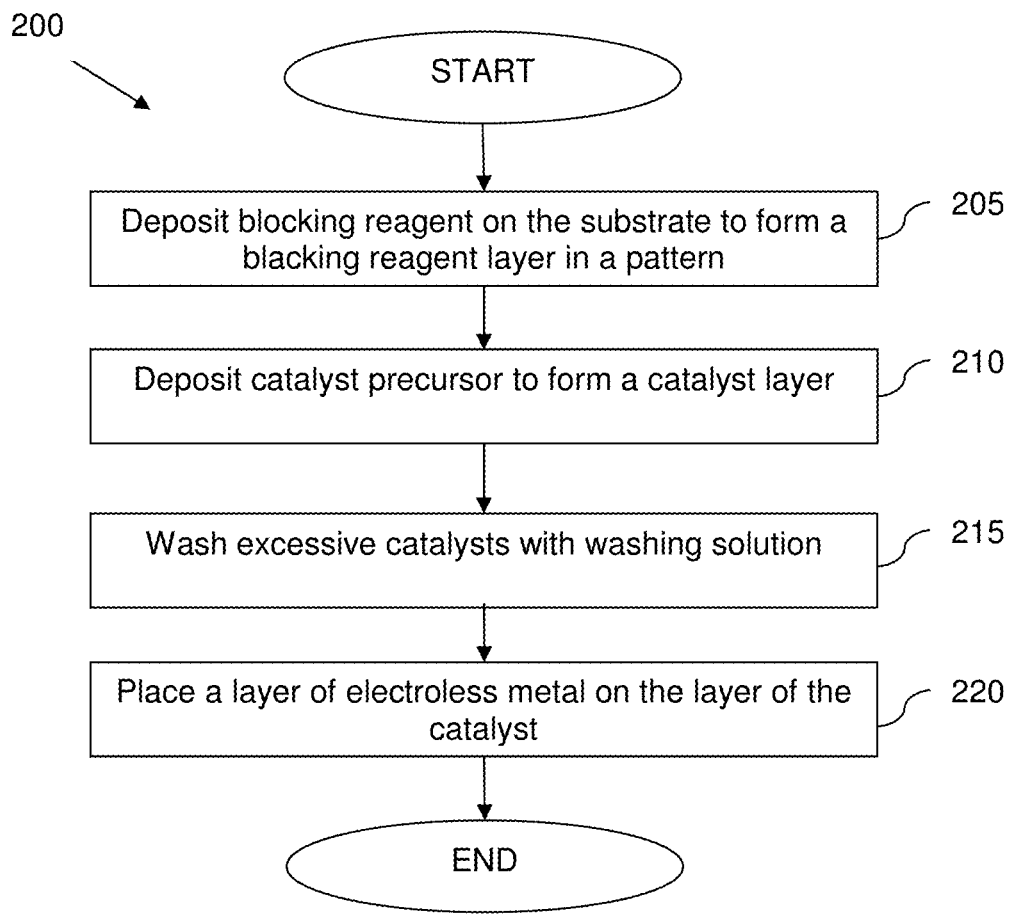
FIG. 2 illustrates a flowchart of another embodiment of a method of patterning of electroless metals.

FIG. 2 illustrates another preferred embodiment of method 200 of patterning of electroless metals using electroless plating. In this embodiment, the method begins with a step of depositing blocking reagent on the substrate to for a blocking reagent layer 205. In a preferred embodiment, the blocking reagent includes copper (II) sulfide (CuS), antimony pentasulfide ($Sb_2S_5$), and other metal sulfides such as iron, tin, copper, antimony, titanium, zirconium, niobium, etc. The blocking reagent can be used in a liquid form (e.g., dissolved in a solvent) or in a paste form (e.g., mixed with resin, epoxy, or other types of polymer, etc.). In a preferred embodiment, the blocking reagent layer is then cured on the substrate at a temperature of at least 80 degree Celsius, at least 100 degree Celsius, or at least 120 degree Celsius.

In some embodiments, the blocking reagent layer can be printed in a pattern on the substrate using various printing techniques. For example, conventional inkjet printers may be used to pattern the removable mask. It is also contemplated that any suitable types of printing technique can be used to generate the pattern: screen printing, pad-printing, Gravure printing, a stencil, rotogravure, flexographic techniques, brush coating, or various other blank coating techniques.

Optionally, once the blocking reagent layer is placed on the substrate, the method can include a step of removing excessive blocking reagent from the substrate by rinsing with rinsing reagent (e.g., a de-smear chemical solution, deionized water, etc.).

Once the patterned blocking agent layer is placed on the substrate, the method continues with a step of placing a layer of a catalyst (e.g., palladium, gold, silver, tin, platinum, etc.) on the substrate having a blocking agent layer 210. Because the blocking reagent blocks or at least substantially inhibits formation of an active catalyst layer, the active catalyst layer can only be significantly formed on the area of the substrate where the blocking reagent layer is not deposited. In some embodiments, the blocking reagent layer allows less than 10% of active catalyst layer formed, preferably less than 5%, more preferably less than 1% of catalyst layer formed, compared to the area not coated with the blocking reagent layer.

Then, the method continues with a step of placing an electroless metal layer (e.g., copper, nickel, etc.) on the catalyst layer 215. As described above, while any suitable methods for depositing various types of electroless metals can be utilized, it is preferred that the substrate with the catalyst layer is bathed or dipped into an electroless metal solution (e.g., a solution of electroless copper, M-22, supplied by MacDermid Inc.).

The use of the blocking reagent can provide several very significant benefits in fabricating the circuit patterns. First, it provides a way to selectively deposit electroless metals in locations and patterns that might be difficult or impossible through a positive imaging of the currently available precursor ink alone. Second, it provides an alternative way for creating a pattern of the catalyst layer using a negative imaging concept. This new blocking reagent can also be used on other catalytic materials and processes that are not easily imageable to allow selective metallization in the form of an image by its blocking functionality. Further, it can provides an additional benefit for the industry as it would allow the simplification of multi-layer printed circuit board manufacturing processes that by providing a more efficient, simpler, and less expensive method of creating functional vias by metalizing only portions of through hole vias rather than a series of blind and hidden vias.

Figure 3:
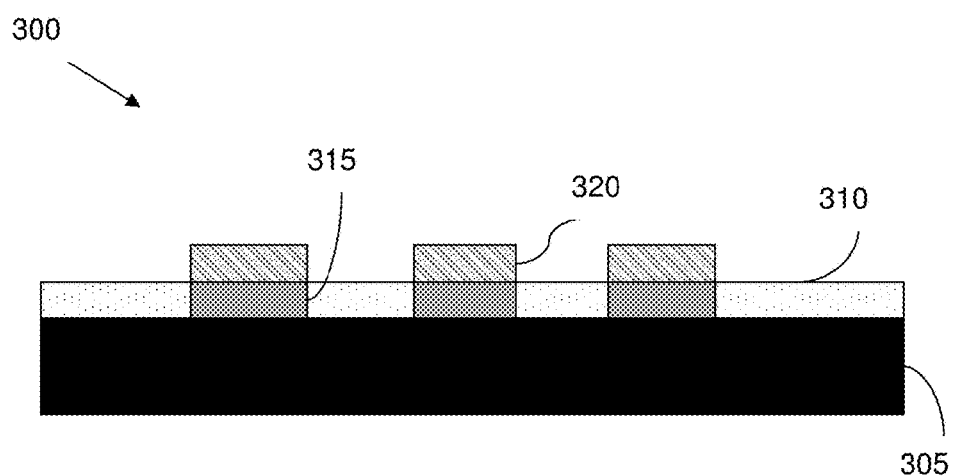
FIG. 3 illustrates one embodiment of a device having an electrical conductivity in a pattern.

Another aspect of the present invention includes a device 300 having an electrical conductivity. FIG. 3 illustrates a diagram of the device 300. The device 300 includes a substrate 305 (e.g., a polyimide, a cloth, a fiber, a plastic, a paper, a metal, a ceramic, and a resin, etc.) coated with a blocking reagent 310 (white, dotted) (copper sulfide (CuS) or Antimony Pentasulfide (Sb2S5), etc.) in a pattern. The device 300 further includes a catalyst layer 315 (e.g., palladium, gold, silver, tin, platinum, etc.), on the substrate 305. Because the blocking reagent inhibits, deters, or at least reduces the formation of active catalyst layer 315, active catalyst layer 315 can be only formed on the area of the substrate 305 where the blocking reagent layer 310 is not laid on. Thus, the pattern of the catalyst layer 315 on the substrate 305 is opposite to the negative pattern of the blocking reagent layer 310.

The device 300 further includes an electroless metal layer 320 (e.g., copper, nickel etc.) on the catalyst layer 315. Because the electroless metal layer 320 can be formed on the catalyst layer 315, but not effectively on the blocking reagent layer 310 that is absent of the catalyst layer, the pattern of the electroless metal layer 320 is according to the catalyst layer 315 that is opposite to the negative pattern of the blocking reagent layer 310.

This conductive pattern formation is suitable for use in circuit manufacture, and can be used widely to create both existing and new circuitry products. For example, the present invention enables and eases printing of conductive lines onto flexible substrates and substrates with custom shapes.

EXAMPLES

We have successfully used palladium (II) propionate and its complexes to deposit active palladium on substrates for electroless copper deposition. The field coated active palladium layer can be selectively deactivated by using sulfur compounds such as yellow ammonium sulfide or potassium polysulfide, etc. Selective patterning can be performed by masking the active layer of palladium deposited on a substrate by using masking agents that are benign to active palladium. The areas having unmasked palladium layer can be exposed to a solution of potassium polysulfide or yellow ammonium sulfide which deactivate the catalytic palladium. The benign masking agents can now be removed to expose active palladium followed by electroless metal deposition to form a pattern of the electrolessly deposited metal on the substrate.

Alternatively, metalized patterns for printed circuit boards can be created with methods include (1) using photolithographic imaging combined with subtractive etch processes; (2) direct laser imaging of metalized patterns by laser ablation of the metal that would have been removed by the subtract etch process in (1); or (3) a combination of (1) and (2) to achieve fine line geometry but not fine spaces.

Figure 4:
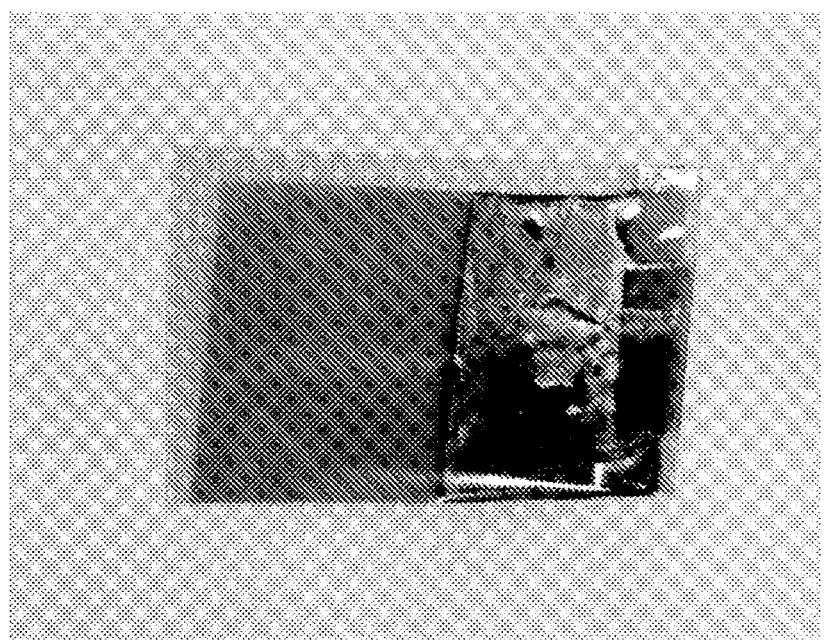
FIG. 4 shows an exemplary photograph of deactivated catalytic layer and overlaid electroless metal layer on the substrate.

The following examples illustrate the principle of catalyst deactivation for preventing electroless metal deposition in selective areas Example I A substrate (e.g., a coupon) of 1 mil-thick polyimide was coated with a solution of amyl acetate containing 3000 ppm of palladium as palladium (II) propionate-cyclopentylamine complex as described in U.S. Pat. No. 8,110,254, which is incorporated in its entity by reference herein, and then heated to 300° C. for 10 minutes. A part of the substrate was dipped in an aqueous solution of potassium polysulfide (3000 ppm) for 1 minute. The substrate was then washed with deionized (DI) water and immersed in a commercial electroless copper solution M-22 supplied by MacDermid, Inc. The part of the substrate that was dipped in the solution of potassium polysulfide did not get deposition of electroless copper as shown in the FIG. 4.

Example II

A substrate (e.g., a coupon) of 1 mil-thick polyimide was coated with a solution of amyl acetate containing 3000 ppm of palladium as palladium (II) propionate-cyclopentylamine complex as described in U.S. Pat. No. 8,110,254, which is incorporated in its entity by reference herein, and then heated to 300° C. for 10 minutes. 5% $Sb_2S_5$ in Dimethyl sulfoxide (DMSO) heated to 160-180° C. and placed a palladium coated polyimide substrate (prepared as previously described) in the solution for 5-7 min. A similar substrate with palladium used as a control without a treatment with $Sb_2S_5$. The substrate without $Sb_2S_5$ could be plated with electroless copper while the $Sb_2S_5$ treated substrate could not be plated with electroless copper.

Example III

Figure 5:
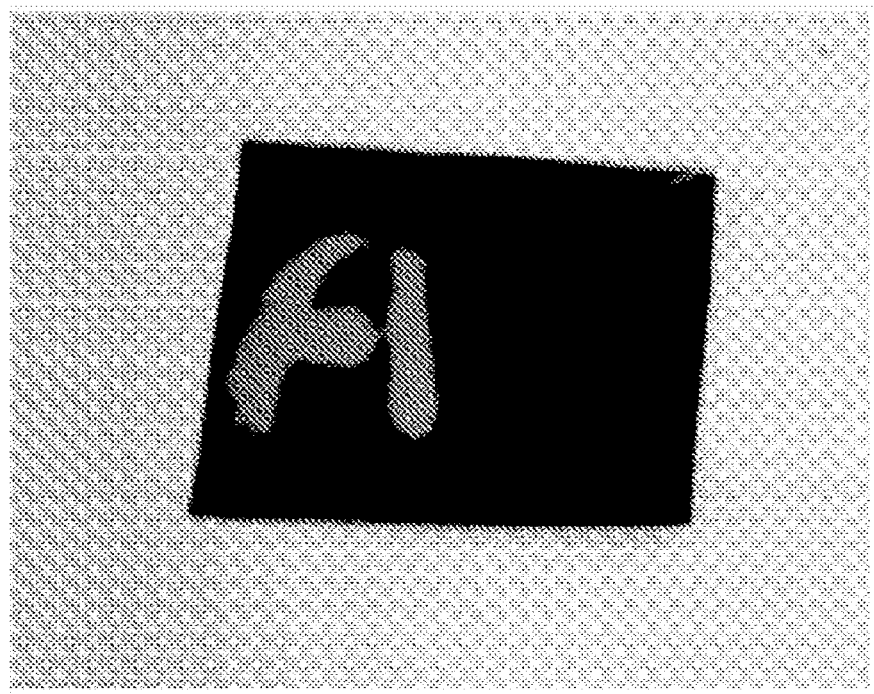
FIG. 5 shows another exemplary photograph of deactivated catalytic layer and overlaid electroless metal layer on the substrate.

A substrate of 1 mil-thick polyimide was field coated with a solution of amyl acetate containing 3000 ppm of palladium as palladium (II) propionate-cyclopentylamine complex as described by U.S. Pat. No. 8,110,254, and then heated to 300° C. for 10 minutes. The letter 'A' was scribed with a 3000 ppm solution of potassium polysulfide in water on the part of the substrate that had thermally cured active palladium catalyst. The substrate was washed with DI water for a minute and dipped in a solution of electroless copper, M-22, supplied by MacDermid, Inc. The area of the substrate with a subscribed letter 'A' did not get deposition of electroless copper as shown in FIG. 5.

Example IV

Palladium blockers can be used in several ways to deactivate active palladium catalyst for electroless copper deposition. Alternatively, the presence of a palladium blocker can also be used to prevent the generation of active palladium that initiates electroless metal deposition. In other words, the method to deactivate catalytic metals deposited on substrates can be used for preventing electroless metal and/or alloy and/or composite deposition by using suitable catalytic deactivators.

One such palladium blocker is CuS. The following example illustrates how CuS can be used for preventing the formation of active palladium catalyst for electroless copper deposition.

Figure 6:
FIG. 6 shows an exemplary photograph of deactivated catalytic layer by blocking reagent and overlaid electroless metal layer on the substrate.

Copper (II) sulfide was ground and kept in vacuum oven at 60° C. for 2 hours. A total of 5 grams of commercially available 2-part Devcon 5-Minute Epoxy™ was squeezed in two Petri dishes to keep both parts separate from each other. 2.5 gram of CuS ground and dried above was added to each part separately. The powder was thoroughly mixed with each part to generate pastes. The pastes were then mixed with each other quickly and then applied to an area of a substrate of an FR-4 epoxy board. The substrate was then cured at room temperature for about 15 minutes and then placed in an oven at 175° C. for 30 minutes. The coupon was then treated with commercially available Rohm and Haas de-smear chemistry available from Dow Chemical, Inc. The substrate was rinsed with DI water and dried in a stream of air. It was then dipped in a solution of 3000 ppm of palladium (II) propionate-cyclopentylamine in amyl acetate for 30 seconds as described in Examples 1 and 3 above. The substrate was initially air dried for 10 minutes and then with an air blower for another 5 minutes to drive off the solvent. It was subsequently placed in an oven at 175° C. for 30 minutes. It was then dipped in MacDermid's M-22 electroless copper plating bath for 10 minutes. Electroless copper did not deposit on the area that was coated with copper sulfide-epoxy paste while other parts of the coupon had deposit of electroless copper as shown in FIG. 6. The areas that had electroless copper are electrically conducting while the copper sulfide-epoxy coated part showed no electrical conductivity subsequent to treatment with electroless copper solution.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of patterning of electroless metals, comprising steps of:
    placing a blocking reagent in a pattern on a substrate to form a substrate with a blocking agent layer;
    removing excessive blocking reagent from the substrate by rinsing with deionized water;
    placing a layer of a catalyst on the substrate having the blocking agent layer;
    placing an electroless metal layer on the catalyst layer; and
    wherein the blocking reagent inhibits formation of the catalyst layer on the blocking agent layer.

2. The method of claim 1, wherein the electroless metal comprises at least one of the following: copper and nickel.

3. The method of claim 1, wherein the substrate comprises at least one of the following: a polyimide, a cloth, a plastic, a metal, a ceramic, and a resin.

4. The method of claim 1, wherein the blocking reagent comprises at least one of the following: copper sulfide (CuS), antimony pentasulfide ($Sb_2S_5$), iron sulfide, tin sulfide, titanium sulfide, zirconium sulfide and niobium sulfide.

5. The method of claim 1, wherein the catalyst comprises at least one of the following:
    palladium, silver, gold, tin and platinum.

6. The method of claim 1, further comprising a step of curing the substrate with a blocking agent layer at a temperature of at least 100 degree Celsius.

7. The method of claim 1, wherein the layer of the catalyst has an average thickness of less than 80 atoms of the catalyst.

8. The method of claim 1, wherein the layer of the catalyst has an average thickness of less than 10 atoms of the catalyst.

* * * * *